United States Patent [19]
Berghaus et al.

[11] Patent Number: 5,237,238
[45] Date of Patent: Aug. 17, 1993

[54] ADJUSTING DEVICE FOR MICROSCOPIC MOVEMENTS

[75] Inventors: Thomas Berghaus, Wiesbaden; Peter Klaede, Frankfurt, both of Fed. Rep. of Germany

[73] Assignee: Omicron Vakuumphysik GmbH, Taunusstein, Fed. Rep. of Germany

[21] Appl. No.: 732,224

[22] Filed: Jul. 18, 1991

[30] Foreign Application Priority Data

Jul. 21, 1990 [DE] Fed. Rep. of Germany ....... 4023311

[51] Int. Cl.⁵ ............................................ H01L 41/08
[52] U.S. Cl. ............................................ 310/328
[58] Field of Search ......................................... 310/328

[56] References Cited

U.S. PATENT DOCUMENTS

| | | | |
|---|---|---|---|
| 3,720,849 | 3/1973 | Bardocz | 310/328 |
| 4,019,073 | 4/1977 | Vishnevsky et al. | 310/328 |
| 4,248,141 | 12/1980 | Vasiliev et al. | 310/328 |
| 4,468,583 | 8/1984 | Mori | 310/328 |
| 4,523,120 | 6/1985 | Assard et al. | 310/328 |
| 4,672,256 | 6/1987 | Okuno et al. | 310/328 |
| 4,678,955 | 7/1987 | Toda | 310/328 |
| 4,785,177 | 11/1988 | Besocke | 250/442.1 |
| 4,874,979 | 10/1989 | Rapp | 310/328 |
| 4,968,914 | 11/1990 | West et al. | 310/328 |
| 5,068,566 | 11/1991 | Culp | 310/328 |
| 5,089,740 | 2/1992 | Ono | 310/328 |

FOREIGN PATENT DOCUMENTS

| | | |
|---|---|---|
| 0027517 | 2/1984 | European Pat. Off. . |
| 0155694 | 9/1985 | European Pat. Off. . |
| 0360975 | 4/1990 | European Pat. Off. . |
| 0724183 | 8/1942 | Fed. Rep. of Germany . |
| 0761373 | 6/1953 | Fed. Rep. of Germany . |
| 2029715 | 12/1971 | Fed. Rep. of Germany . |
| 3610540 | 10/1987 | Fed. Rep. of Germany . |

OTHER PUBLICATIONS

"Ein neues Konzept fur die Rastertunnel-Mikroskopie", 1987–1988 Annual Report of the Nuclear Research Div. of Julich GmbH, pp. 23–31.

"Micropositioning Systems", publication of Burleigh Instruments, undated, pp. 1–8, 10–12.

"Burleigh Micropositioning Products", Burleigh Instruments GmbH, D–6102 Pfungstadt, Germany pp. 1–4.

"Novel Three-Dimensional Positioner and Scanner for the STM Using Shear Deformation of Piezoceramic Plates", Japanese Journal of Applied Physics, . . . (cont'd) vol. 27, No. 1, Jan. 1988, pp. L123–L126.

*Primary Examiner*—Mark O. Budd
*Assistant Examiner*—Thomas M. Dougherty
*Attorney, Agent, or Firm*—H. Gibner Lehmann; K. Gibner Lehmann

[57] ABSTRACT

The description relates to an adjusting device 1 for microscopic movements and comprising a carrier element 3 with, fixed on the carrier element 3, drive elements 6a, 6b, 6c which have a piezoelectric transducer which utilises the shear effect and which have a bearing element 5 which rests on the drive elements 6a, b, c. So that such an adjusting device 1, regardless of its position, is able to carry out high-precision reproducible microscopic movements, in particular also movements in a vertical direction being possible while under load, the form and disposition of drive element 6 and bearing element 5 are designed for the performance of a guided microscopic movement. In addition, a pressure applying device 8 is provided which presses the bearing element 5 and the drive element 6 against one another with a predetermined force. Preferably, the pressure applying device comprises at least one magnet 17 which attracts the bearing element 5 with an adjustable force. According to particular embodiments, guided rotary movements are also feasible with the adjusting device according to the invention.

16 Claims, 9 Drawing Sheets

ADJUSTING DEVICE FOR MICROSCOPIC MOVEMENTS

DESCRIPTION

The invention relates to an adjusting device for microscopic movements, with a carrier element with, fixed on the carrier element, at least one drive element comprising a piezoelectric transducer which utilises the shear effect, and with a bearing element which rests on the drive element.

An adjusting device for linear or angular displacements of carrier plates in relation to base plates is known for example from DE-PS 20 29 715. Such adjusting devices comprise spindles, micrometers and screws for performing linear and rotary movements. For guiding the carrier plates on the base plates, the carrier plates are provided with grooves in which run balls for example.

However, this prior art adjusting device cannot be used for mechanically high-precision movement patterns in microtechnique, because the fine adjustment desired for these applications cannot be attained by the aforesaid mechanical displacement means.

Known from DE-PS 76 13 73 is a mechanical adjusting device for electron microscopes with which however no fine adjustment in the sub-nanometer range is possible. Adjustment of the table which has to rest on a sliding surface is accomplished by means of adjusting screws which move the table against thrust members. The adjustment path is limited by the spring travel of the counter-thrust members, the increase in opposing force leading to a nonlinear adjustment characteristic as the compression of the springs increases. Nor is a reproducible movement possible since a laterally clearance-free mounting can be accomplished only with extreme difficulty.

Particularly in the case of scanning tunnel microscopy with which surface structures can be examined with a resolution in the sub-nanometer range are adjustment means required which correspondingly permit of a displacement or a rotary movement in the sub-nanometer range.

In order to cope with these needs, micromanipulators have been developed such as are known from DE-PS 36 10 540. Such a micromanipulator is capable of microscopic movement of objects in X-, Y- and Z-directions, where the object is resting on three hollow cylinder-like piezoelectric movement elements. These tiny piezoelectric tubes have on one wall of the cylinder a closed electrically conductive coating and on the other wall of the cylinder a plurality of electrically insulated conductive partial coatings. By applying voltages between the electrically conductive coatings, the small piezoelectric tubes can be bent in any desired directions. By rapidly bending and straightening the tubes, the object placed on these piezoelectric tubes is displaced in a stepwise manner. However, this micromanipulator has a number of drawbacks. The movement of the object is not reproducible and in particular it is not uni-dimensionally guided. This means that during reverse movement of the object, the starting point is not attained again but in fact in the case of surface examinations in high-resolution microscopy, in which the same areas of the surface have to be approached many times in reproducible fashion, this is a vital requirement.

A further disadvantage lies in the fact that the micromanipulator is only capable of moving the object horizontally. Movement of the object in a vertical plane is not provided for, nor is it possible, since in this case the object would not be reliably supported on the piezoelectric tubes. It is true that there is mention of the possibility of the object being pressed down onto the piezoelectric tubes by a spring but this only increases the stability of the arrangement as a whole. Therefore, use in any plane other than the horizontal plane is not made possible by it. Other obstacles to this are also the minimal loading capacity and in particular the minimal lateral stability of the piezoelectric tubes which in particular have a tendency to break when they are bent by the applied voltage and are loaded at the same time.

In K. Besocke "Ein neues Konzept fur die Raster-Tunnel-Mikroskopie/A New Concept for Scanning Tunnel Microscopy", in a special reprint from the 1987/88 Annual Report of the Nuclear Research Division of Julich GmbH, pp. 23 to 31, there is a description of a microadjustment device in which, in addition to the use of the piezoelectric tubes such as are known from EP-00 27 517, a specimen holder is also used and comprises a bearing ring. The supporting surfaces of the piezoelectric tubes are screwed oblique planes, so that upon actuation of the piezoelectric tubes, the bearing ring is rotated and at the same time performs a movement parallel with the piezoelectric tubes. Even this arrangement does not permit of any reproducible movements.

Known from EP 00 27 517 is an adjusting device in which an H-shaped piezoelectric member moves along like a worm in a trough-like guide member. The construction and control with four-phase driving currents is complicated and expensive and also has the drawback that the moving piezoelectric member can only accept a very low loading in the direction of movement. Where this development is concerned, the piezoelectric member can carry little more than its own weight in a vertical direction since otherwise there is an uncontrolled sliding of the piezoelectric member in the guide arrangement.

Furthermore, an absolute dimensional precision of the guide member and of the piezoelectric member in the micrometer range or even better is required. Manufacturing costs are high, therefore.

Known from the in-house publication "Micro Positioning Systems" of Messrs. BURLEIGH INSTRUMENTS is the so-called Inchworm. In a concentric disposition within three tube-like piezoelectric elements, two of which, by varying their diameters, clamp the movable element while the third one moves the cylinder by altering its length. A significant disadvantage of this construction is the inadequate security against rotation and the necessary manufacturing precision since here again an easily-moving fit in the sub-micrometer range is required and this calls for corresponding manufacturing costs.

A so-called XY-Walker is known from Kiyohiko Uozumi "Novel three dimensional positioner and scanner for the STM using shear deformation of piezo ceramic plates" in the Japanese Journal of Applied Physics, Vol. 27, No. 1, January 1988, page L 123 to L 126. On the under side of the object to be moved are fixed several piezoelectric transducers of which at least two permit a raising of the object while at least two others perform a shear movement in order to displace the object sideways. The piezoelectric transducers must be so actuated that whenever the object is raised the shear movement of the other piezoelectric transducers is performed. This shear movement must persist until such time as the object has been lowered again and is thus resting on the sheared piezoelectric transducers. Afterwards, the sheared piezoelectric transducers are sheared in the opposite direction and the entire object is raised again. This adjusting device does not offer any reproducible guided movements either and it can only be used for horizontal movements.

Therefore, the object of the present invention is to provide an adjusting device which, while being of simple construction and comprising only a few component parts, guarantees high-precision and reproducible microscopic movements regardless of its position, especially movements under load and in a vertical direction being possible.

This problem is resolved by an adjusting device in accordance with the features set out in claim 1. A particular embodiment for rotary movements is the object of claim 2. Advantageous further developments are the objects of the sub-claims.

The invention is based on the knowledge that where adjusting devices in the micro range are concerned, the driving element and the guide means do not have to constitute two separate devices in order to be able to perform a guided movement within the micro range. A simple construction of an adjusting device for microscopic movements is achieved in that the drive elements which comprise piezoelectric transducers with a shear capability produce not only the movement of the bearing element but in addition also guide the bearing element in the direction of movement.

According to the invention, only the drive element and the bearing element are in their form and disposition constructed for reciprocal mounting and for the execution of a guided microscopic movement. The device can be so designed that the bearing element or the carrier element performs the microscopic movements, as a movable element.

The adjusting device according to the invention can be constructed to perform both linear and also rotary movements. Preferably, by reason of its design, the bearing element is adapted to the form and/or disposition of the drive element as a safeguard against rotation about the direction of movement if it is constructed as a linear adjusting device or against displacement if it is constructed as a rotary adjusting device.

For an adjusting device which performs linear movements, it is in particular advantageous for the movable element of be a partially cylindrical rod the cylinderal surface of which rests on at least three piezoelectric transducers or on a piezoelectric transducer which has three supporting surfaces. The three supporting points are preferably disposed in the manner of a tripod.

To ensure a guided movement of the movable element, it is necessary according to the range of use for the bearing element and the disposition or the form of the driving element(s) to be adapted to one another. The shear effect offers the only advantage that the thickness of the piezoelectric transducer at right-angles to the adjusting device remains constant during deflection and that for an identically applied voltage the deflection is independent of the thickness of the transducer. Thus, manufacturing tolerances are immaterial and in particular any desired configuration is possible and the thicknesses may vary.

Saving on a separate guide device also reduces the friction losses so that the force applied by the piezoelectric transducers can be used entirely for moving the movable element. Consequently, yet another movement of the movable element is made possible if this element has to be moved in a vertical direction and is carrying a load.

Instead of a partially cylindrical rod, it is also possible to use a rod with a polygonal cross-section, and in this case the rod has two of its lateral surfaces resting on at least three support points on the drive element(s). According to the intended purpose, so it is possible also for four or more drive elements to be used.

A further embodiment envisages the bearing element consisting of a plate with a guide groove which is preferably formed by two parallel cylindrical rods.

This bearing element likewise rests on at least three drive elements or one drive element with three support points, the bearing element resting on two drive elements in the guide groove formed by the two cylindrical rods and, with the plate, resting on the third drive element. The two drive elements engaging the cylindrical rods ensure an accurate linear guidance, while the third drive element takes over a supporting function and provides a safeguard against rotation.

In order to be able to carry out rotary movements, the bearing element is in a preferred embodiment constructed as a rotationally symmetrical component which has a peripheral surface. It may for example be a cylinder or a cone, the drive element and thus also the piezoelectric transducer being adapted to the form of the peripheral surface. In order to bring about a rotary movement of the bearing element, the drive element is polarised in the peripheral direction so that when a voltage is applied to the piezoelectric transducer, this latter performs a shearing action in the peripheral direction and entrains the bearing element in so doing.

The carrier element which carries the drive element or elements can, in the case of this embodiment, simultaneously take over the function of the pressure applying means if it at least partially encloses the drive element and is subject to an initial mechanical tension so that the drive element presses against the rotationally symmetrical component.

According to a further embodiment, the bearing element is constructed as a turntable.

This may take the form of a truncated cone the conical surface of which rests on at least three piezoelectric transducers which are substantially equidistant from one another. According to a further embodiment, the bearing element constructed as a turntable has a clearance-free pivot bearing and rests on at least one and preferably two drive elements. The pivot bearing is preferably a sphere which rests in a conical recess in the turntable. The distances from the bearing point to the piezoelectric transducers and between the respective piezoelectric transducers are preferably substantially equal. In this developed embodiment, the bearing and guidance are not produced exclusively by the bearing element and the drive element.

A rotary movement can also be combined with a linear movement. In this case, instead of the conical recess in the turntable, a groove can be provided in which rests a further drive element which performs the linear movement of the turntable.

The drive elements on which the surface of the turntable rests comprises piezoelectric members the shear movement of which acts in various directions. A part of the piezoelectric element acts in a radial direction while the other part acts in a tangential direction.

Another essential constituent part of the adjusting device according to the invention resides in the pressure applying means which make sit possible for the movable element to be fixed, allowing the adjusting device to be used in any desired position. The pressure applying means presses the bearing element with a preferably adjustable or structurally predetermined force against the drive elements.

The pressure applying means is so disposed that the force exerted by it acts at right-angles to the direction of movement of the movable element. This embodiment offers the advantage that the maximum travel path of the movable element is not limited by the ejection device, as is the case with the state of the art. Instead, the entire adjustment path is likewise limited by the length of the movable element, while the utmost precision and reproducibility are retained.

So that the pressure applying device does not retard the movement of the bearing element, this latter, according to one embodiment, likewise comprises at least one piezoelectric transducer which has shear capability. This piezoelectric transducer which is part of the pressure applying means acts by reason of spring force and presses on the bearing element, performing the appropriate shear movement in the same way as the other piezoelectric transducers. By virtue of the fact that in this case the bearing element rests solely on drive elements, friction losses are minimised. The disposition of the spring loaded piezoelectric transducer is such that it presses the bearing element against and thus clamps it on the drive elements. This ensures that the movable element can be reliably secured in any position and that by virtue of the clamping effect the movable element can also be loaded in opposition to the direction of movement without this leading to an uncontrolled sliding of the movable element during the movement process or even when at rest.

If a partially cylindrical rod or a cross-sectionally polygon rod is used as the movable element, the spring loaded piezoelectric transducer preferably engages the flat surface of the rod and in this way presses the rod against the piezoelectric transducer on which the semicylindrical surface of the rod or, if it is of polygonal cross-section, its lateral surfaces rest.

With rod-shaped bearing elements, it has proved to be advantageous for the pressure applying means to comprise in addition to the spring loaded piezoelectric transducer also a fixed piezoelectric transducer which is disposed at a distance from the spring loaded transducer when the spring loaded transducer and the additional piezoelectric transducer are disposed one beside the other at right-angles to the direction of movement of the rod, a rotation of the bar about the longitudinal axis is effectively prevented.

In accordance with a further embodiment, the pressure applying device may consist of magnets which are disposed at a distance from the bearing element. The magnet or magnets is or are preferably disposed on the fixed component between the drive elements and by the forces of magnetic attraction they press the bearing element against the drive elements. This pressure applying means has the advantage that no additional friction losses occur and that the side of the rod remote from the drive elements is freely accessible over its entire length.

By the use of piezoelectric transducers which have shear capability, parallelepiped piezoelectric elements can be used which can accept a far greater load than for example the small piezoelectric tubes known from the state of the art.

An essential advantage is the compact overall height of the shearing piezoelectric elements of less than 1 mm, while the Besocke type tubes typically have a length of 10 mm. The result is a substantially improved stability in the lateral direction both with regard to force effect and also with regard to vibration sensitivity.

Deflection of the piezoelectric transducers depends upon a material constant and upon the applied voltage pulse. To permit large step sizes, it may for particular applications be advantageous for a plurality of piezoelectric transducers to be disposed on one another because in this case the deflections of the individual piezoelectric transducers are added to one another. The piezoelectric elements are in each case separated by an electrically conductive coating which is needed in order to apply the voltage pulse to the piezoelectric elements.

Since the step size also depends upon the applied voltage pulse, the piezoelectric transducers are connected to a control unit which is constructed to deliver different voltage pulses. In addition to the value of the voltage pulse, also the time pattern of the voltage pulse is important. If the voltage is increased slowly (flat pulse flank) until it reaches its maximum value, the piezoelectric transducer reacts with a correspondingly slow shear movement. In this case, during the shear movement of the piezoelectric transducers, the bearing element is entrained. If after reaching the maximum voltage value the voltage is rapidly removed (steep pulse flank), the piezoelectric transducer returns to its starting position at a corresponding speed, the bearing element remaining in its position by reason of the mass of inertia.

The other possibility resides in firstly passing through the steep flank of the voltage pulse with the result that the piezoelectric transducer by virtue of its rapid shear movement and the mass of inertia of the bearing element slides along the bearing element. If then the slow flank of the voltage pulse is travelled, then the piezoelectric transducer moves at correspondingly low speed back to its starting position, entraining the bearing element with it.

These movement steps can be performed in rapid sequence one after another so that even translatory or rotary movements of the order of millimetres can be accomplished within a few seconds. Surprisingly, it has been found that for the same maximum voltage a more rapid cycle of movements can be achieved if it is first the gentle slope of the voltage pulse and only then the steep slope of the voltage pulse which is traversed.

According to the quality of the bearing surface, experience shows that the smallest reliable step size is about 20 nm. An even more precise positioning can be achieved by utilising the entraining effect if the rate of rise of the voltage pattern is not too rapid.

Thus, over and above stepwise positioning, continuous positioning is possible, a relative accuracy of approx. 1 nm being typically possible over a total range of some 100 nm up to 1 $\mu$m. To this end, the control unit is designed with an additional facility for continuous actuation.

For greater adjustment paths or angles, the absolute positioning accuracy of the adjusting device can be considerably increased by integrating a path of positioning measurement facility. By feed-back of the path or position signal, a predetermined position can be attained precisely. This feed-back can be used both for stepwise and also for continuous positioning.

Although the bearing element can rest directly on the piezoelectric transducers, it is advantageous in the light of friction losses to provide at least one punctiform support. Such a support consists of a ball fixed on a ball seating which is in turn disposed on that side of the piezoelectric transducer which is towards the bearing element. The ball consists of aluminium oxide while the bearing element is preferably made from hardened steel. Other combinations of materials may also be used so long as the support and the bearing element do not tend to seize under the forces which occur.

The adjusting device (sic!) according to the invention can be combined with one another in any desired manner, so that X-, Y-, Z-adjusting devices can be provided or even adjusting devices in which a rotary movement can be combined with a linear movement or a plurality of rotary movements can be combined with one another.

If an embodiment of adjusting device is chosen in which the carrier element serves as a stationary element, then the movable element may be endless. This provides particularly an opportunity for the continuous feed of material. For example, a soldering or welding wire can be continuously supplied with a high level of positioning accuracy.

By way of example, examples of embodiment of the invention are explained in greater detail hereinafter with reference to the accompanying drawings, in which.

Figure 1:
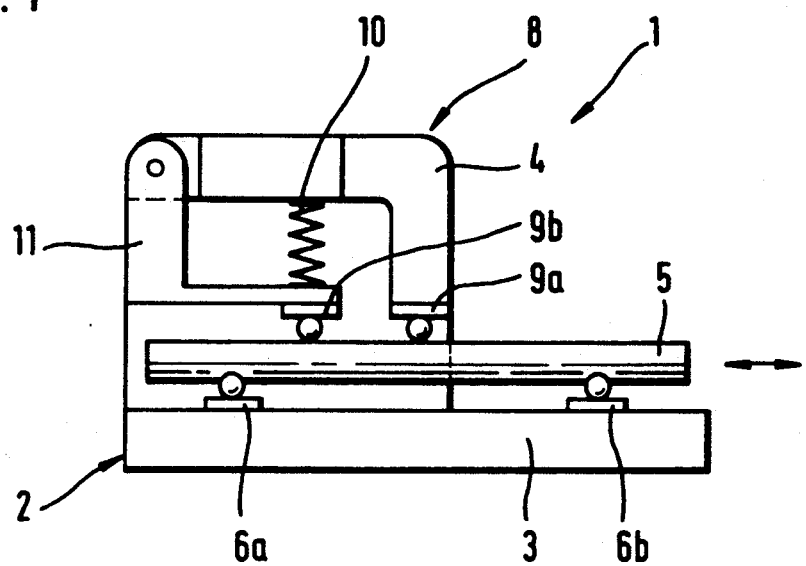
FIG. 1 is the side view of a linear adjusting device.
Figure 3:
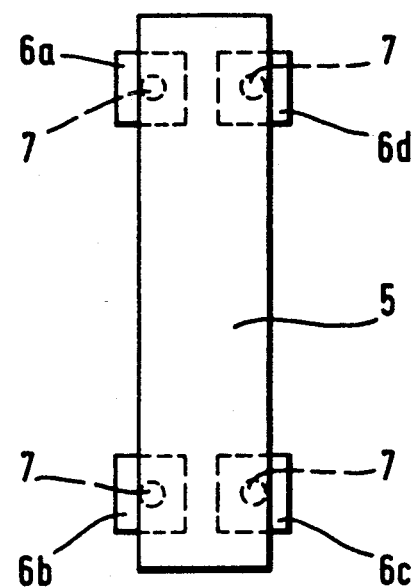
FIG. 3 is a plan view of the bearing element.

FIG. 1 shows an adjusting device 1 for linear displacements. As shown in FIG. 3, a total of four drive elements 6a, 6b, 6c and 6d are mounted on a stationary carrier element 2 which has a base plate 3 and a support arm 4. These drive elements comprise a support 27 (see FIG. 9) comprising a ball 7 and a ball seating 12. Resting on the balls 7 is the movable bearing element 5 which can be displaced in the direction of the arrow by means of piezoelectric transducers 33 which have a shear capability.

For fixing the bearing element 5, a pressure applying device 8 is provided which is mounted on a support arm 4. On the under side of a movable support plate 11 there is fixed a piezoelectric transducer 9b which belongs to the pressure applying device and the ball 7 of which presses down on the bearing element 5 from above. The force with which the piezoelectric transducer 9b presses on the movable element 5 is determined by the spring 10 which is biased on the under side of the support arm 4. Fixed on the support arm 4 is a further piezoelectric transducer 9a which likewise presses on the movable element 5 from above.

Figure 2:
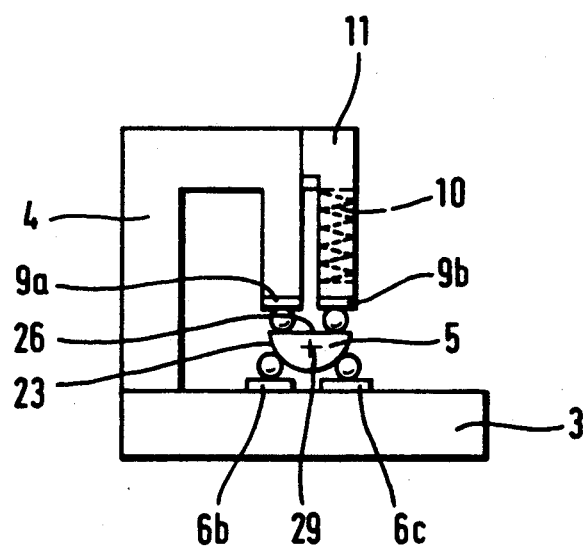
FIG. 2 is a front view of the adjusting device shown in FIG. 1.

As FIG. 2 shows, the bearing element 5 consists of a semicylindrical rod the cylindrical surface 23 of which rests on the balls 7 of the drive elements 6a to 6d. The two piezoelectric transducers 9a and 9b of the pressure applying device 8 press from above on the flat surface 26 of the movable element 5. In this view, the two piezoelectric transducers 9a and 9b are disposed one beside the other. This prevents the rod 5 rotating about the longitudinal axis 29 when linear movement is being performed. The effect of the spring force transmitted by the piezoelectric transducer 9b is that the movable bearing element 5 rotates slightly about the longitudinal axis 29, its flat surface 26 coming to rest on the piezoelectric transducer 9a. If the force of the spring 10 is suitably adjusted, a stable position of the movable bearing element 5 is achieved and at the same time a clamping effect is accomplished which prevents the movable bearing element slipping, for example when the adjusting device is being used vertically.

Figure 4:
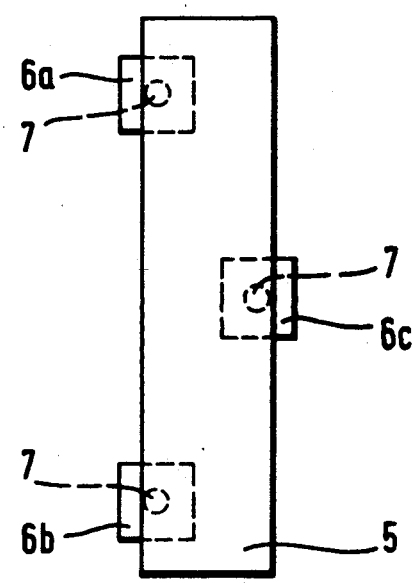
FIG. 4 is a plan view of the bearing element according to a further embodiment.

FIG. 3 shows that a total of four drive elements 6a, 6b, 6c and 6d are disposed under the movable bearing element 5. According to FIG. 4, three drive elements 6a to 6c are provided which are disposed in the manner of a tripod under the movable element 5.

Figure 5:
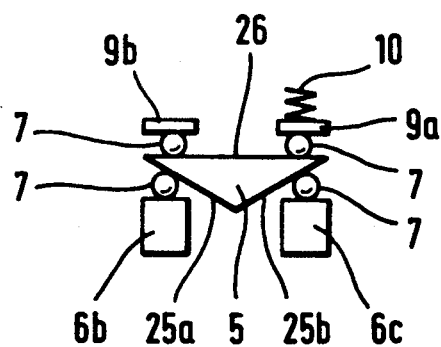
FIG. 5 and 5a are front views of three different embodiments of an adjusting device.

FIG. 5 shows a movable bearing element 5 of triangular cross-section. The rod 5 has its lateral faces 25a and 25b resting on the already described drive elements 6a to 6d. The pressure applying device 8 presses down from above onto the flat surface 26. Also shown in this view are two piezoelectric transducers 9a and 9b which clamp the movable bearing element 5 on the drive elements 6a to 6d.

Figure 6:
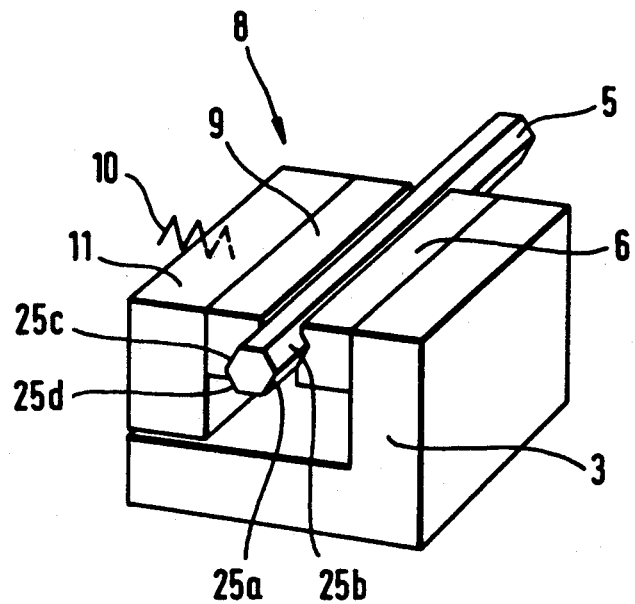
FIG. 6 is a perspective view of a further embodiment.

FIG. 6 shows a bearing element 5 of hexagonal cross-section. The rod has two lateral surfaces 25a, 25b resting on just one appropriately formed drive element 6 which has a piezoelectric transducer which is capable of shear in the direction of the rod.

By the shape given to the drive element 6 and the piezoelectric transducers 9 in conjunction with the hexagonal cross-section of the rod 5, guidance is achieved in the direction of movement and at the same time the rod 5 is secured against rotation. From the other side, the pressure applying device 8 presses down on two further side faces 25c, 25d. In this illustration, only one correspondingly shaped piezoelectric transducer 9 is provided which presses the movable bearing element 5 with a clamping action against the drive element 6.

Figure 5A:
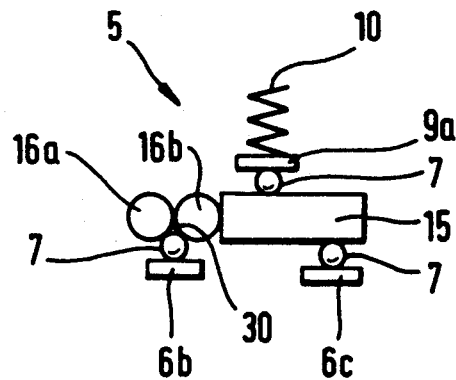
Figure 7:
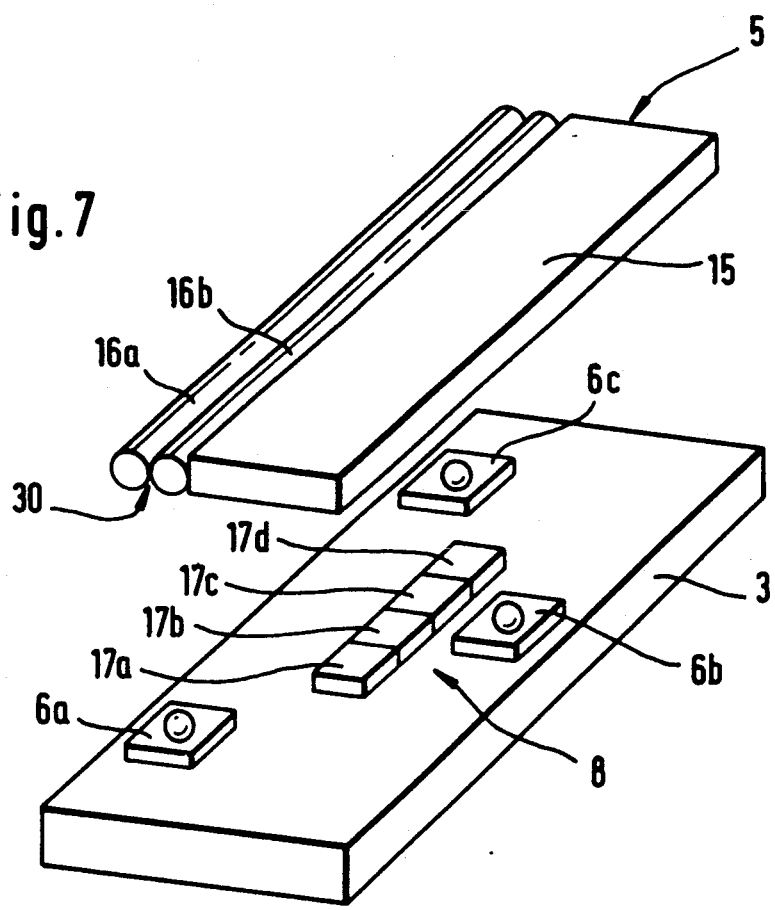
FIG. 7 is a perspective view of a further embodiment.

FIGS. 5a and 7 show further embodiments of the bearing element 5. This latter comprises two cylindrical rods 16a and 16b which are connected to each other. Furthermore, a plate 15 is disposed on the cylindrical rod 16b.

FIG. 5a shows that the two cylindrical rods 16a and 16b form a guide groove 30 in which the ball 7 of the drive element 6b is centered. A further drive element 6c is disposed beneath the plate 15 which likewise rests on a ball 7. In this embodiment, only the piezoelectric transducer 9a bears down under spring force on the plate 15 of the movable bearing element 5.

FIG. 7 shows a further version of the pressure applying device 8. Instead of a pressure applying device acting from above, there are below the bearing element 5 a plurality of magnets 17a to 17d on the base plate which attract the bearing element 5 which consists of ferromagnetic material, pressing it in this way onto the three drive elements 6a to 6c which are likewise disposed on the base plate 3.

Figure 8:
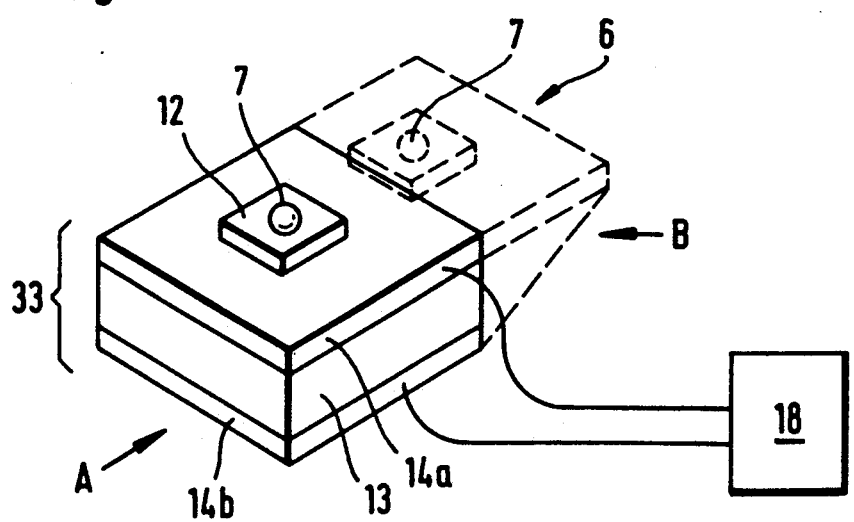
FIG. 8 is a perspective view of a drive element.

FIG. 8 shows a drive element 6 which in this form also uses the pressure applying device. The piezoelectric transducer 33 has a piezoelectric body 13 of a piezoelectric material with a shear capacity and which has on its top and bottom surfaces respective electrically conductive coatings 14a, 14b connected to a control unit 18. The control unit 18 delivers a voltage pulse to the piezoelectric transducer 33 so that this moves out of its inoperative position A into a shear position B. The shear position B of the piezoelectric transducer 33 is shown by the broken lines. Fixed on the upper electrical coating 14a is the ball seating 12 with the ball 7 which is preferably made from aluminium oxide. The ball 7 is moved as a result of the shear movement (position B).

Figure 9A:
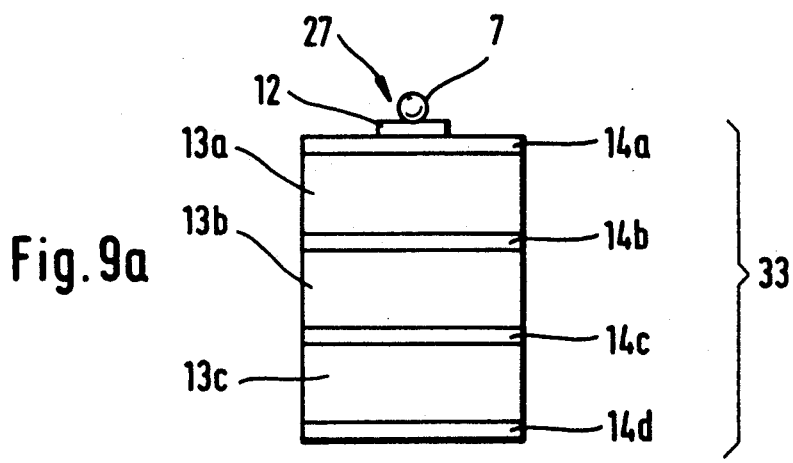
FIG. 9a is a side view of an assembled piezoelectric transducer.

Deflection of the ball 7 from its inoperative position depends inter alia upon the applied voltage and the material constants of the piezoelectric material. In order to achieve large step sizes, it is possible as shown in FIG. 9a for the piezoelectric transducer 33 to be composed of a plurality of piezoelectric elements 13a to 13c which are isolated from one another by respective conductive coatings 14b and 14c. The bottom and top piezoelectric elements 13c, 13a also comprise an electrically conductive coating 14a and 14d. These electrically conductive coatings 14a to 14d are likewise connected to the control unit 18. Since when the voltage pulse is applied all the piezoelectric elements 13a to 13c perform the same shear movement, the individual deflections become cumulative.

Figure 9B:
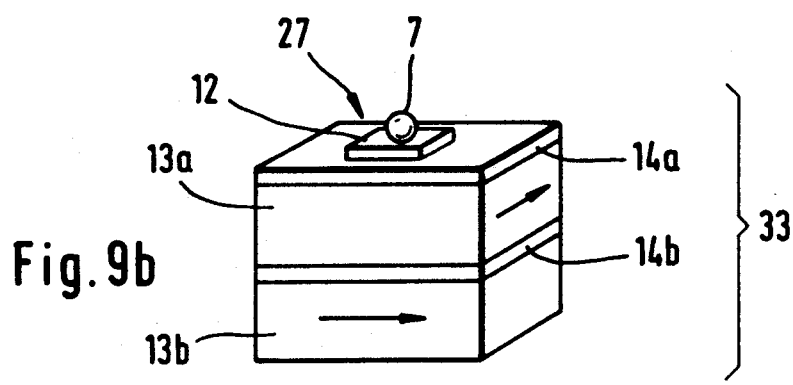
FIG. 9b is a perspective view of a two-dimensional transducer.

FIGS. 9a and 9b show a ball 7 on a ball seating 12, the ball and ball seating constituting a punctiform support.

Shown in FIG. 9b is a piezoelectric transducer 33 in which the piezoelectric elements 13a, 13b shear in different directions. Preferably, the shear directions are at right-angles to one another.

Figure 10:
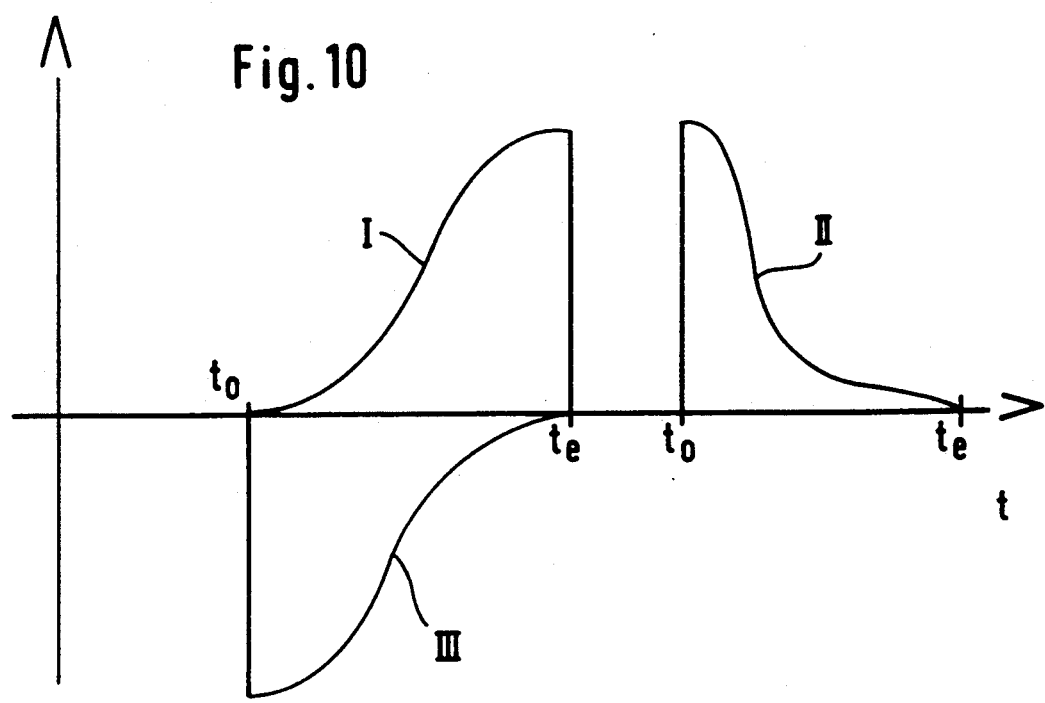
FIG. 10 is a graphic representation of the time-related pattern of the voltage applied to the piezoelectric transducers.

FIG. 10 shows the time related pattern of the voltage pulse applied to the piezoelectric transducer. The curve 1 firstly shows a slowly rising voltage pattern (gentle slope) and the steep voltage drop (the steep side of the pulse) which is adjacent to it. The overall duration of the pulse $t_e$-$t_o$ preferably amounts to 0.2 to 2 msec. The voltage value is around 500 V and the shear deflection of the piezoelectric transducer amounts to approx. 200 nm. This voltage pattern has the effect that the shear movement of position A shown in FIG. 8 moves slowly to position B while the return movement from position B to position A is performed rapidly.

A second possibility is illustrated by the curve II in which, starting at $t_o$, the voltage is raised to its maximum value within a period of less than 10 $\mu$sec which corresponds to a rapid shear movement. This is then followed by a slow abatement of voltage which again reaches zero value after the time $t_e$. In this way, a slow return movement of the piezoelectric transducer is achieved.

In addition, curve III appears in the drawing. It corresponds to the curve I but for reversed polarisation of the transducer.

Figure 11:
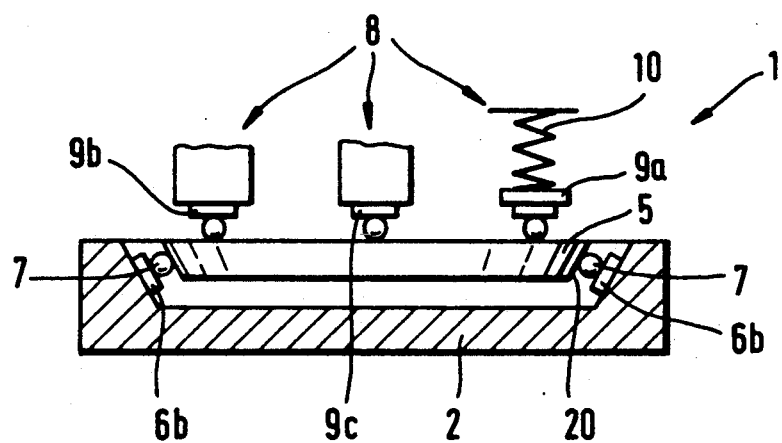
FIG. 11 is a cross-section through a rotary adjusting device.

FIG. 11 shows a rotary adjustment device 1 in which the movable bearing element 5 is constructed as a turntable. The turntable has as frustoconical shape and its conical surface 20 rests on the drive elements 6a and 6b which are fitted in a trough-shaped stationary carrier element 2. The drive elements 6a and 6b are so disposed on the stationary carrier element 2 that they perform the shear movement in a rotary direction. From above, the pressure applying device 8 which takes the form of the stationary piezoelectric transducer 9b, 9c and the spring loaded piezoelectric transducer 9a, presses down on the turntable 5.

Figure 12:
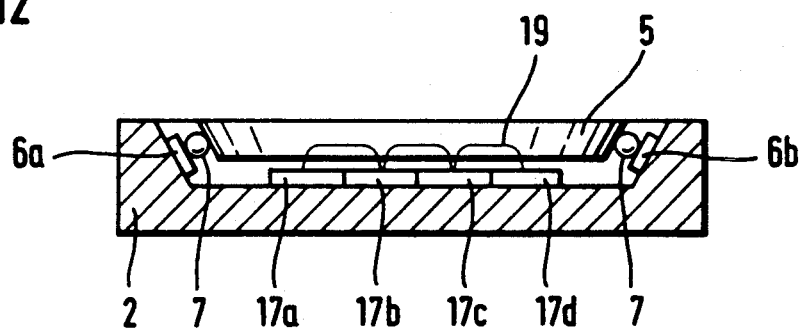
FIG. 12 is a cross-section through a rotary adjusting device according to a further embodiment.

Instead of the pressure applying device 8, FIG. 12 shows a magnetic pressure applying device. The magnets 17a to 17d are likewise disposed on the stationary trough-like component 2 underneath the turntable 5. The force lines 19 extend at right-angles to the under side of the turntable 5.

Figure 13:
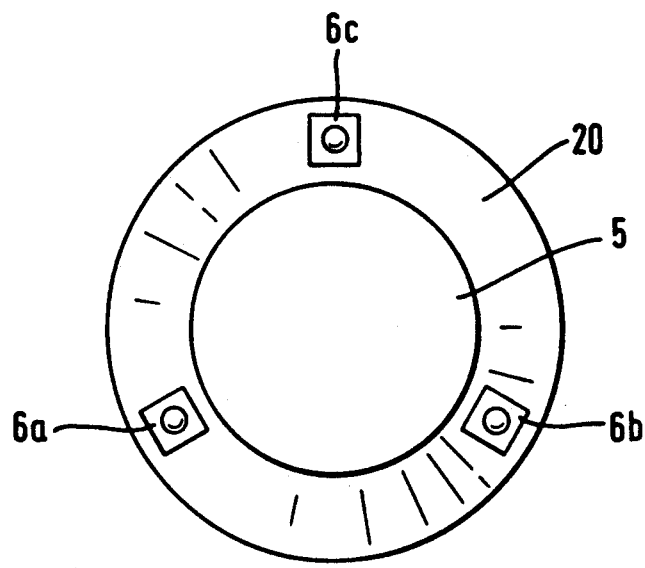
FIG. 13 is a view from below of the turntable shown in FIGS. 11 or 12.

As shown in FIG. 13, a total of three drive elements 6a to 6c are equidistantly disposed on the conical surface 20.

Figure 14:
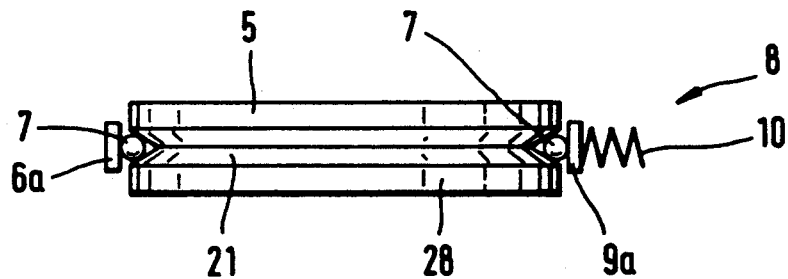
FIG. 14 is a side view of a further embodiment of a rotary adjusting device.

FIG. 14 shows a further embodiment of turntable 5 which takes the form of a circular disc in the peripheral surface 28 of which there is incorporated a groove 21 in which rest the balls 7 of the drive elements 6a, 6b. With this embodiment, only two drive elements 6a and 6b (not shown) are needed, while the third piezoelectric transducer 9a is at the same time spring loaded and constitutes the pressure applying device 8.

Figure 15:
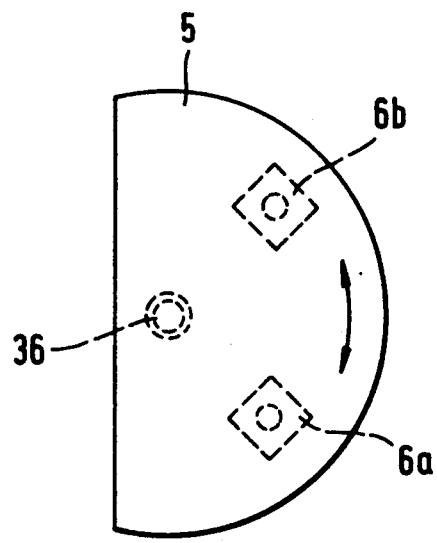
FIGS. 15, 15a are respectively plan and side views of a further embodiment of rotary adjusting device.
Figure 15A:
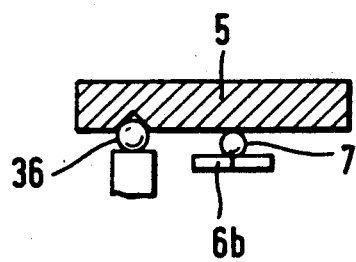

In FIGS. 15, 15a, the turntable 5 is mounted on a ball 36 disposed in the centre of the turntable. The drive elements 6a and 6b are, in this embodiment, disposed on the under side of the turntable 5.

Figure 15B:
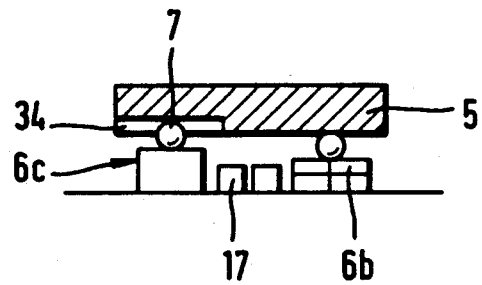
FIGS. 15b, 15c, 15d are plan and side views of a combined linear and rotary adjusting device.
Figure 15C:
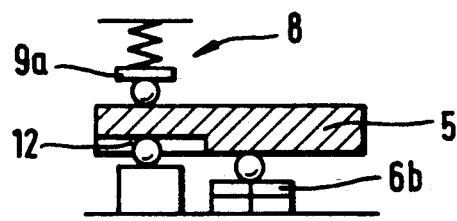
Figure 15D:
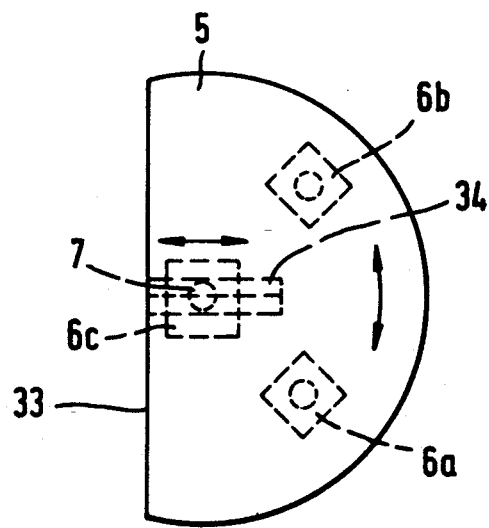
Figure 16A:
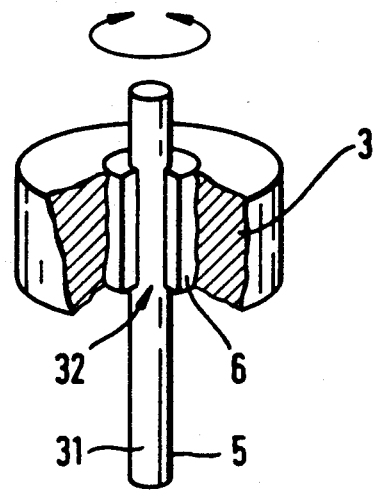
FIGS. 16a, 16b are perspective views of a further embodiment of an adjusting device and of an appropriate piezoelectric transducer.
Figure 16B:
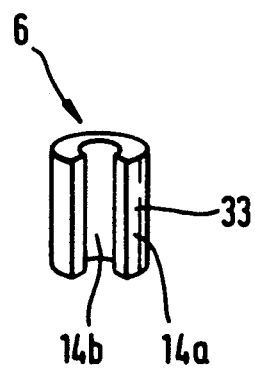

Shown in FIGS. 15b, c, d is an adjusting device for linear and rotary movement. The turntable 5 which in the illustration here takes the form of a portion of a circle, has on its under side a groove 34 in which rests the ball 7 of a further drive element. The groove 34 is preferably V-shaped so that the turntable 5 is also laterally guided. In the view shown here, the groove 34 is disposed at a right-angle to the long side 33. The turntable also rests on the two drive elements 6c, 6b which perform the rotary movement, as FIGS. 15, 15a show. FIGS. 15b and 15c show the turntable combined with two different pressure applying devices which have already been described. In FIG. 16, rotationally symmetrical component 31 takes the form of a cylindrical rod 5 which is axially disposed in a drive element 6 which takes the form of a cylinder from which a portion has been cut out. The drive element 6 has its outer periphery pressed by the base plate 3 against the peripheral surface 32 of the rod. The piezoelectric electric transducer 33 contained in the drive element 6 is polarised along the periphery and the electrodes 14a, 14b are formed by the inner and outer surfaces of the cylinder.

Figure 17:
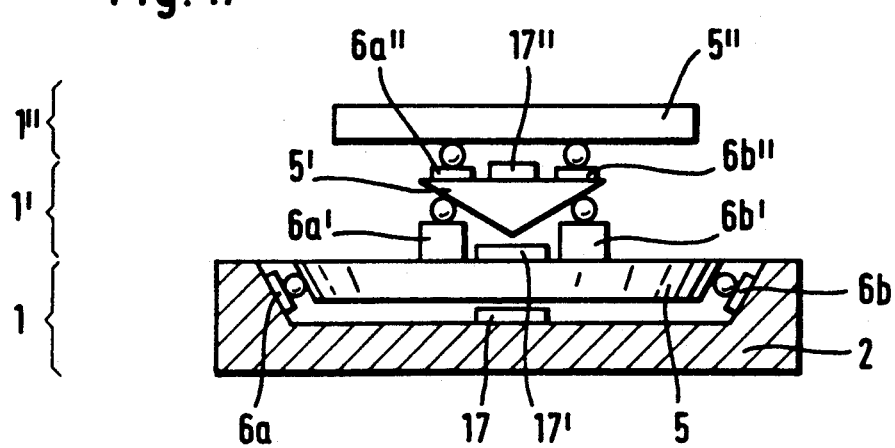
FIG. 17 is a diagrammatic view of a combination of three adjusting devices.

FIG. 17 shows a multiple adjusting device which is constructed from a total of three adjusting devices 1, 1' and 1" according to the invention. The bottom adjusting device 1 is a rotary adjusting device such as is described as illustrated in FIG. 12. Fixed on the turntable 5 is a linear adjusting device 1' which has a movable bearing element 5' of triangular cross-section. The turntable 5 at the same time constitutes the stationary element 2 of the adjusting device 1'. Mounted on the movable element 5' is a further linear adjusting device 1" which has a movable element 5". Here, too, the movable element 5' is at the same time the stationary element of the adjusting device 1". The pressure applying devices of the three adjusting devices 1, 1' and 1" are formed by magnets 17, 17' and 17" which are respectively disposed beneath the movable elements 5, 5' and 5".

We claim:

1. An adjusting device for microscopic movements, with a carrier element with, fixed on the carrier element, at least one drive element comprising a piezoelectric transducer which utilises the shear effect, and with a bearing element which rests on the drive element, characterized in that only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right-angles to the direction of movement, and characterised in that the bearing element (5) is a cross-sectionally partially cylindrical or polygonal rod, of which the cylindrical surface (23) or at least two of its lateral surfaces (25a, 25b) rest on at least one drive element (6).

2. An adjusting device for microscopic movements, with a carrier element with, fixed on the carrier element, at least one drive element comprising a piezoelectric transducer which utilises the shear effect, and with a bearing element which rests on the drive element, characterized in that only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right-angles to the direction of movement, and characterised in that the bearing element (5) is a displaceable plate (15) having a guide groove (30) in which rests the drive element (6), and in that the guide groove (30) is constituted by two cylindrical rods (16a, 16b) which are fixed on the displaceable plate (15) and which bear on each other.

3. An adjusting device for microscopic movements, with a carrier element with, fixed on the carrier element, at least one drive element comprising a piezoelectric transducer which utilises the shear effect, and with a bearing element which rests on the drive element, characterized in that only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right-angles to the direction of movement, and characterized in that the bearing element (5) is a turntable, said turntable (5) being constructed as a truncated cone the conical surface (20) of which rests on at least one drive element (6).

4. An adjusting device for microscopic movements, with a carrier element with, fixed on the carrier element, at least one drive element comprising a piezoelectric transducer which utilises the shear effect, and with a bearing element which rests on the drive element, characterized in that only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right-angles to the direction of movement, and characterised in that the pressure applying device has at least one piezoelectric transducer (9a) biased by a spring (10).

5. A device according to claim 4, characterised in that the pressure applying device (8) has at least one further piezoelectric transducer (9b) which is fixed and which is disposed at a distance from the piezoelectric transducer (9a).

6. An adjusting device for microscopic movements, with a carrier element with, fixed on the carrier element, at least one drive element comprising a piezoelectric transducer which utilises the shear effect, and with a bearing element which rests on the drive element, characterized in that only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right-angles to the direction of movement, and characterized in that on the side of the piezoelectric transducer (33) which is towards the bearing element (5) there is at least one punctiform support (27), said punctiform support (27) consisting of a ball (7) mounted on a ball seating (12).

7. A device according to claim 6, characterised in that the ball consists of $Al_2O_3$.

8. An adjusting device for microscopic movements, with a carrier element (2) with, fixed on the carrier element, at least one drive element (6) comprising a piezoelectric transducer which utilises the shear effect, and with a bearing element (5) which rests on the drive element, characterized in that a pressure applying device (8) is provided which presses the bearing element (5) and the drive element (6) against each other with a predetermined force at right-angles to the direction of movement, and characterized in that to trigger the shear effect drive of the piezoelectric transducer, a control unit (18) is connected to the piezoelectric transducer which delivers voltage pulses to it, said pulses having a gently rising or falling flank which is followed by a steeply falling or rising flank, respectively and wherein the bearing element (5) has inertia which is largely overcome by the gently rising or falling flank to cause the bearing element (5) to move, said inertia essentially preventing reverse movement of the bearing element (5) by the steeply falling or rising flank.

9. An adjusting device for microscopic movements, with a carrier element (2) with, fixed on the carrier element, at least one drive element (6) comprising a piezoelectric transducer which utilises the shear effect, and with a bearing element (5) which rests on the drive element, characterized in that a pressure applying device (8) is provided which presses the bearing element (5) and the drive element (6) against each other with a predetermined force at right-angles to the direction of movement, and characterized in that to trigger the shear effect movement of the piezoelectric transducer, a control unit (18) is connected to the piezoelectric transducer which delivers to the transducer a predetermined voltage pattern with different rise and fall times, in order to drive the bearing element (5) within the framework of the maximum deflection of the piezoelectric transducer (6), said bearing element (5) having inertia whereby it responds with one displacement corresponding to a predetermined rise time, and responds with a different displacement corresponding to a predetermined fall time which is different from said rise time.

10. An adjusting device for microscopic movements, with a carrier element with, fixed on the carrier element, at least one drive element comprising a piezoelectric transducer which utilizes the shear effect, and with a bearing element which rests on the drive element, characterized in that only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right angles to the direction of movement, said bearing element (5) being a rotationally symmetrical cylindrical component (31) having a peripheral surface (32) and which bears on at least one drive element (6) adapted to the shape of the peripheral surface (32), the piezoelectric transducer (33) being polarised in the peripheral direction of the peripheral surface (32), said bearing element (5) being a cylindrical rod (31) while the drive element (6) is a hollow cylinder from which a portion has been cut and which engages around the bearing element (5).

11. A device according to claim 10, characterized in that the carrier element (2) at least partially surrounds the hollow cylinder (6) and is at an initial tension so that the hollow cylinder (6) is pressed against the bearing element (5).

12. An adjusting device for microscopic movements, with a carrier element with, fixed on the carrier element, at least one drive element comprising a piezoelectric transducer which utilizes the shear effect, and with a bearing element which rests on the drive element, characterized in that only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right angles to the direction of movement, said pressure applying device (8) having at least one magnet (17) which is fixed on an element (2 or 5) and which is disposed at a distance from the other element (5 or 2).

13. A device according to claim 12, characterized in that the magnet (17) is disposed on the carrier element (2) between the drive elements (6a, 6b, 6c) and attracts the bearing element (5) with an adjustable force.

14. An adjusting device for microscopic movements, with a carrier element with, fixed on the carrier element, at least one drive element comprising a piezoelectric transducer which utilizes the shear effect, and with a bearing element which rests on the drive element, characterized in that only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right angles to the direction of movement, in that to trigger the shear movements of the piezoelectric transducers (9, 33), a control unit (18) is connected to the piezoelectric transducers which simultaneously delivers identical voltage pulses to all the piezoelectric transducers (9, 33), in that the control unit (18) delivers voltage pulses which initially have a gently rising or falling flank which is followed by a steeply falling or rising flank, in that the control unit (18) delivers an adjustable or predetermined voltage pattern in order continuously to position the movable element (2 or 5) within the framework of the maximum deflection of the piezoelectric transducers (9, 33), and in that the control unit (18) comprises a device for measuring the adjustment path or angle of adjustment, the measured signal serving to linearise and to increase the accuracy of positioning.

15. An adjusting device for microscopic movements, with a carrier element with, fixed on the carrier element, at least one drive element comprising a piezoelectric transducer which utilizes the shear effect, and with a bearing element which rests on the drive element, characterized in that only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right angles to the direction of movement, in that to trigger the shear effect drive of the piezoelectric transducer, a control unit (18) is connected to the piezoelectric transducer which delivers voltage pulses to it, said pulses having a gently rising or falling flank which is followed by a steeply falling or rising flank, respectively, and wherein the bearing element (5) has inertia which is largely overcome by the gently rising or falling flank and which results in movement of the bearing element (5), said inertia essentially preventing reverse movement of the bearing element (5) by the steeply falling or rising flank of the pulses.

16. An adjusting device for microscopic movements, with a carrier element with, fixed on the carrier element, at least one drive element comprising a piezoelectric transducer which utilizes the shear effect, and with a bearing element which rests on the drive element, characterized in that only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right angles to the direction of movement, in that to trigger the shear effect drive of the piezoelectric transducer, a control unit (18) is connected to the piezoelectric transducer which delivers to the transducer an adjustable voltage pattern with predetermined different rise and fall times, in order to continuously position the bearing element (5) within the framework of the maximum deflection of the piezoelectric transducer (6), said bearing element (5) having inertia whereby it responds with one displacement corresponding to said predetermined rise time, said displacement being different from that corresponding to said different predetermined fall time.

* * * * *

EX PARTE REEXAMINATION CERTIFICATE (6428th)

United States Patent
Berghaus et al.

(10) Number: US 5,237,238 C1
(45) Certificate Issued: Sep. 16, 2008

(54) ADJUSTING DEVICE FOR MICROSCOPIC MOVEMENTS

(75) Inventors: Thomas Berghaus, Wiesbaden (DE); Peter Klaede, Frankfurt (DE)

(73) Assignee: Omicron Vakuumphysik GmbH, Taunusstein (DE)

Reexamination Request:
No. 90/007,918, Feb. 6, 2006

Reexamination Certificate for:
Patent No.: 5,237,238
Issued: Aug. 17, 1993
Appl. No.: 07/732,224
Filed: Jul. 18, 1991

(30) Foreign Application Priority Data

Jul. 21, 1990 (DE) .............................................. 4023311

(51) Int. Cl.
*H01L 41/09* (2006.01)
*H01J 37/20* (2006.01)

(52) U.S. Cl. ...................................................... 310/328
(58) Field of Classification Search .................. 310/328
See application file for complete search history.

(56) References Cited

U.S. PATENT DOCUMENTS

| | | | |
|---|---|---|---|
| 4,019,073 A | | 4/1977 | Vishnevsky et al. |
| 4,171,159 A | * | 10/1979 | White ........................ 356/502 |
| 4,727,278 A | | 2/1988 | Satufenberg, Jr. et al. |
| 4,766,311 A | * | 8/1988 | Seiler et al. ............... 250/252.1 |
| 4,928,030 A | | 5/1990 | Culp |
| 4,959,552 A | * | 9/1990 | Saffert et al. ........... 250/559.26 |
| 4,975,614 A | | 12/1990 | Honda |
| 4,987,526 A | * | 1/1991 | Slocum et al. ................. 700/56 |
| 4,992,728 A | * | 2/1991 | McCord et al. ............. 324/764 |
| 4,999,495 A | * | 3/1991 | Miyata et al. ............... 250/306 |
| 5,051,646 A | | 9/1991 | Elings et al. |
| 5,083,022 A | * | 1/1992 | Miyamoto et al. .......... 250/306 |
| 5,196,745 A | * | 3/1993 | Trumper ..................... 310/12 |

* cited by examiner

*Primary Examiner*—Roland G. Foster

(57) ABSTRACT

The description relates to an adjusting device 1 for microscopic movements and comprising a carrier element 3 with, fixed on the carrier element 3, drive elements 6a, 6b, 6c which have a piezoelectric transducer which utilises the shear effect and which have a bearing element 5 which rests on the drive elements 6a, b, c. So that such an adjusting device 1, regardless of its position, is able to carry out high-precision reproducible microscopic movements, in particular also movements in a vertical direction being possible while under load, the form and disposition of drive element 6 and bearing element 5 are designed for the performance of a guided microscopic movement. In addition, a pressure applying device 8 is provided which presses the bearing element 5 and the drive element 6 against one another with a predetermined force. Preferably, the pressure applying device comprises at least one magnet 17 which attracts the bearing element 5 with an adjustable force. According to particular embodiments, guided rotary movements are also feasible with the adjusting device according to the invention.

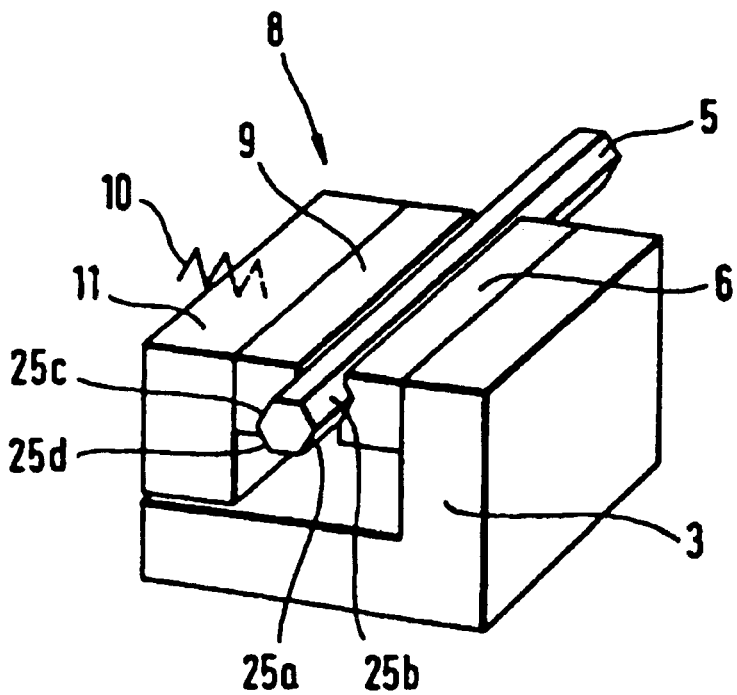

US 5,237,238 C1

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 3, lines 17–21:

This problem is resolved by an adjusting device in accordance with the features set out in [claim 1] *the claims*. A particular embodiment for rotary movements is [the] *a further* object of [claim 2] *the claims*. Advantageous further developments are the objects of the sub-claims.

Column 7, lines 14–20:

The adjusting [device (sic!)] *devices* according to the invention can be combined with one another in any desired manner, so that X-, Y-, Z-adjusting devices can be provided or even adjusting devices in which a rotary movement can be combined with a linear movement or a plurality of rotary movements can be combined with one another.

Column 8, lines 1–10:

FIG. 1 shows an adjusting device 1 for linear displacements. As shown in FIG. 3, a total of four drive elements 6a, 6b, 6c and 6d are mounted on a stationary carrier element 2 which has a base plate 3 and a support arm 4. These drive elements comprise a support 27 (see [FIG. 9] *FIGS. 9a and 9b*) comprising a ball 7 and a ball seating 12. Resting on the balls 7 is the movable bearing element 5 which can be displaced in the direction of the arrow by means of piezoelectric transducers 33 which have a shear capability.

Column 9, line 59–column 10, line 2:

FIG. 10 shows the time related pattern of the voltage pulse applied to the piezoelectric transducer. The curve [1] *I* firstly shows a slowly rising voltage pattern (gentle slope) and the steep voltage drop (the steep side of the pulse) which is adjacent to it. The overall duration of the pulse $t_e - t_o$ preferably amounts to 0.2 to 2 msec. The voltage value is around 500 V and the shear deflection of the piezoelectric transducer amounts to approx. 200 nm. This voltage pattern has the effect that the shear movement of position A shown in FIG. 8 moves slowly to position B while the return movement from position B to position A is performed rapidly.

AS A RESULT OF REEXAMINATION, IT HAS BEEN DETERMINED THAT:

Claims 1–16 are determined to be patentable as amended.

New claim 17 is added and determined to be patentable.

1. An adjusting device for microscopic movements, [with] *comprising: a driven bearing element (5), a* carrier element [with, fixed on the carrier element,] *and* at least one drive element (6) *adapted to perform unidirectional movement wherein said drive element (6) is fixed to the carrier element and wherein said driven bearing element (5) directly rests on said drive element (6) mutually being in frictional contact with each other, said drive element (6)* comprising a piezoelectric transducer [which] *directly providing said frictional contact or a piezoelectric transducer having its own support to support the driven bearing element (5) and to provide said frictional contact, wherein said support is disposed on a side of the piezoelectric transducer which is towards said driven bearing element (5), wherein the piezoeolectric transducer* utilises the shear effect, [and with a bearing element which rests on the drive element, characterized in that] *wherein the* drive element (6) produces not only the movement of the driven bearing element (5), but in addition, also guides the driven bearing element (5) in the direction of movement and *wherein* only the *at least one* drive element (6) and the *driven* bearing element (5) are in their form and disposition constructed for mutual mounting and for the performance of a guided microscopic movement, [and in that] *wherein a* pressure applying device (8) is provided which presses the *driven* bearing element (5) and the drive element (6) against each other with a predetermined force at right-angles to the direction of movement, and [characterised in that] *wherein* the bearing element (5) is a cross-sectionally partially cylindrical or polygonal rod, of which the cylindrical surface (23) or at least two of its lateral surfaces (25a, 25b) rest on at least one drive element (6).

2. An adjusting device for microscopic movements, with a carrier element with, fixed on the carrier element, at least one drive element comprising a piezoelectric transducer which utilises the shear effect, and with a bearing element which rests on the drive element, [characterized in that] *wherein* only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right-angles to the direction of movement, and characterised in that the bearing element (5) is a displaceable plate (15) having a guide groove (30) in which rests the drive element (6), and in that the guide groove (30) is constituted by two cylindrical rods (16a, 16b) which are fixed on the displaceable plate (15) and which bear on each other.

3. An adjusting device for microscopic movements, [with a carrier element with, fixed on the] *comprising: a driven bearing element (5), a carrier element, and* at least one drive element (6) *adapted to perform unidirectional movement, wherein said drive element (6) is fixed to the carrier element and wherein said driven bearing element (5) directly rests on said drive element (6) mutually being in frictional contact with each other wherein said drive element (6)* comprising a piezoelectric transducer [which] *directly providing said frictional contact or a piezoelectric transducer having its own support to support the driven bearing element (5) and to privde said frictional contact, wherein said support is disposed on a side of the piezoelectric transducer which is towards said driven bearing element (5), wherein the piezoelectric transducer* utilises the shear effect, [and with a bearing element which rests on the drive element, characterized in that only] *wherein* the drive element (6) *produces not only* the movement of the driven bearing element (5), but in addition, also guides the driven bearing element (5) in the direction of movement and *wherein* only the *at least one* drive element (6) and the *driven* bearing element (5) are in their form and disposition constructed for mutual mounting and for the performance of a guided microscopic mvoement, and in that a pressure applying device (8) is provided which presses the *driven* bearing element (5) and the drive element (6) against each other with a predetermined force at right-angles to the direction of movement, and characterized in that the bearing element (5) is a turntable, said turntable (5) being constructed as a truncated cone the conical surface (20) of which rests on at least one drive element (6).

4. An adjusting device for microscopic movements, [with] *comprising: a driven bearing element (5)*, a carrier element [with, fixed on the carrier element,] *and* at least one drive element (6) *adapted to perform unidirectional movement wherein said drive element (6) is fixed to the carrier element and wherein said driven bearing element (5) directly rests on said drive element (6) mutually being in frictional contact with each other, said drive element (6)* comprising a piezoelectric transducer [which] *directly providing said frictional contact or a piezoelectric transducer having its own support to support the driven bearing element (5) and to provide said frictional contact, wherein said support is disposed on a side of the piezoelectric transducer which is towards said driven bearing element (5), wherein the piezoelectric transducer* utilises the shear effect, [and with a bearing element which rests on the drive element, characterized in that] *wherein the drive element (6) produces not only the movement of the driven bearing element (5), but in addition, also guides the driven bearing element (5) in the direction of movement and wherein* only the *at least one* drive element (6) and the *driven* bearing element (5) are in their form and disposition constructed for mutual mounting and for the performance of a guided microscopic movement, and in that a pressure applying device (8) is provided which presses the *driven* bearing element (5) and the drive element (6) against each other with a predetermined force at right-angles to the direction of movement, and characterised in that the pressure applying device has at least one piezoelectric transducer (9a) biased by a spring (10).

5. A device according to claim 4, [characterised in that] *wherein* the pressure applying device (8) has at least one further piezoelectric transducer (9b) which is fixed and which is disposed at a distance from the piezoelectric transducer (9a).

6. An adjusting device for microscopic movements, with a carrier element with, fixed on the carrier element, at least one drive element comprising a piezoelectric transducer which utilises the shear effect, and with a bearing element which rests on the drive element, [characterized in that] *wherein* only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right-angles to the direction of movement, and characterized in that on the side of the piezoelectric transducer (33) which is towards the bearing element (5) there is at least one punctiform support (27), said punctiform support (27) consisting of a ball (7) mounted on a ball seating (12).

7. A device according to claim 6, [characterised in that] *wherein* the ball consists of $Al_2O_3$.

8. An adjusting device for microscopic movements, with a carrier element (2) with, fixed on the carrier element, at least one drive element (6) comprising a piezoelectric transducer which utilises the shear effect, and with a *driven* bearing element (5) which rests on the drive element, [characterized in that] *wherein* a pressure applying device (8) is provided which presses the *driven* bearing element (5) and the drive element (6) against each other with a predetermined force at right-angles to the direction of movement, and characterized in that to trigger the shear effect drive of the piezoelectric transducer, a control unit (18) is connected to the piezoelectric transducer which delivers voltage pulses to it, said pulses having a gently rising or falling flank which is followed by a steeply falling or rising flank, respectively and wherein the *driven* bearing element (5) has inertia which is largely overcome by the gently rising or falling flank to cause the *driven* bearing element (5) to move, said inertia essentially preventing reverse movement of the bearing element (5) by the steeply faling or rising flank, *wherein the steeply falling or rising flank is performed within a time period of less than 10 μsec.*

9. An adjusting device for microscopic movements *according to claim 8*, [with a carrier element (2) with, fixed on the carrier element, at least one drive element (6) comprising a piezoelectric transducer which utilises the shear effect, and with a bearing element (5) which rests on the drive element, characterized in that a pressure applying device (8) is provided which presses the bearing element (5) and the drive element (6) against each other with a predetermined force at right-angles to the direction of movement, and characterized in that] *wherein* to trigger the shear effect movement of the piezoelectric transducer, a control unit (18) is connected to the piezoelectric transducer which delivers to the transducer a predetermined voltage pattern [with different rise and fall times,] in order to drive the *driven* bearing element (5) within the framework of the maximum deflection of the piezoelectric transducer (6)[, said bearing element (5) having inertia whereby it responds with one displacement corresponding to a predetermined rise time, and responds with a different displacement corresponding to a predetermined fall time which is different from said rise time].

10. An adjusting device for microscopic movements, with a carrier element with, fixed on the carrier element, at least one drive element comprising a piezoelectric transducer which utilizes the shear effect, and with a bearing element which rests on the drive element, [characterized in that] *wherein* only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right angles to the direction of movement, said bearing element (5) being a rotationally symmetrical cylindrical component (31) having a peripheral surface (32) and which bears on at least one drive element (6) adapted to the shape of the peripheral surface (32), the piezoelectric transducer (33) being polarised in the peripheral direction of the peripheral surface (32), said bearing element (5) being a cylindrical rod (31) while the drive element (6) is a hollow cylinder from which a portion has been cut and which engages around the bearing element (5).

11. A device according to claim 10, [characterised in that] *wherein* the carrier element (2) at least partially surrounds the hollow cylinder (6) and is at an initial tension so that the hollow cylinder (6) is pressed against the bearing element (5).

12. An adjusting device for microscopic movements, [with] *comprising:* a driven bearing element (5), a carrier element [with, fixed on the carrier element,] *and* at least one drive element (6) *adapted to perform unidirectional movement, wherein said drive element (6) is fixed to the carrier element and wherein said driven bearing element (5) directly rests on said drive element (6) mutually being in frictional contact with each other,* said drive element (6) comprising a piezoelectric transducer [which] *directly providing said frictional contact or a piezoelectric transducer having its own support to support the driven bearing element (5) and to provide said frictional contact, wherein said support is disposed on a side of the piezoelectric transducer which is towards said driven bearing element (5), wherein* the piezoelectric transducer utilizes the shear effect, [and with a bearing element which rests on the drive element, characterized in that] *wherein* the drive element (6) produces not only the movement of the driven bearing element (5), but in addition, also guides the driven bearing element (5) *in the direction of movement and* wherein only the *at least one* drive element (6) and the *driven* bearing element (5) are in their form and disposition constructed for mutual mounting and for the performance of a guided microscopic movement, [and in that] *wherein* a pressure applying device (8) is provided which presses the *driven* bearing element (5) and the drive element (6) against each other with a predetermined force at right angles to the direction of movement, *wherein said pressure applying device (8) having at least one magnet (17) which is fixed either on* [an] *the carrier element (2 [or 5]) or on the driven bearing element (5) and which is disposed at a distance from the corresponding other element (5 or 2).*

13. A device according to claim 12, [characterized in that] *wherein* the magnet (17) is disposed on the carrier element (2) between the drive elements (6a, 6b, 6c) and attracts the bearing element (5) with an adjustable force.

14. An adjusting device for microscopic movements, with a carrier element with, fixed on the carrier element, at least one drive element comprising a piezoelectric transducer which utilizes the shear effect, and with a bearing element which rests on the drive element, [characterized in that] *wherein* only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right angles to the direction of movement, in that to trigger the shear movements of the piezoelectric transducers (9, 33), a control unit (18) is connected to the piezoelectric transducers which simultaneously delivers identical voltage pulses to all the piezoelectric transducers (9, 33), [in that] *wherein* the control unit (18) delivers voltage pulses which initially have a gently rising or falling flank which is followed by a steeply falling or rising flank, [in that] *wherein* the control unit (18) delivers an adjustable or predetermined voltage pattern in order continuously to position the movable element (2 or 5) within the framework of the maximum deflection of the piezoelectric transducers (9, 33), and in that the control unit (18) comprises a device for measuring the adjustment path or angle of adjustment, the measured signal serving to linearise and to increase the accuracy of positioning, *wherein the steeply falling or rising flank is performed within a time period of less than 10 μsec.*

15. An adjusting device for microscopic movements, [with] *comprising:* a driven bearing element (5), a carrier element [with, fixed on the carrier element,] *and* at least one drive element (6) *adapted to perform unidirectional movement, wherein said drive element (6) is fixed to the carrier element and wherein said driven bearing element (5) directly rests on said drive element (6) mutually being in frictional contact with each other wherein said drive element* (6) comprising a piezoelectric transducer [which] *directly providing said frictional contact or a piezoelectric transducer having its own support to support the driven bearing element (5) and to provide said frictional contact, wherein said support is disposed on a side of the piezoelectric transducer which is towards said driven bearing element (5), wherein* the piezoelectric transducer utilizes the shear effect, [and with a bearing element which rests on the drive element, characterized in that] *wherein* the drive element (6) produces not only the movement of the driven bearing element (5), but in addition, also guides the driven bearing element in the direction of movement and wherein only the *at least one* drive element (6) and the *driven* bearing element (5) are in their form and disposition constructed for mutual mounting and for the performance of a guided microscopic movement, [and in that] *wherein* a pressure applying device (8) is provided which presses the *driven* bearing element (5) and the drive element (6) against each other with a predetermined force at right angles to the direction of movement, *and characterized* in that to trigger the shear effect drive of the piezoelectric transducer, a control unit (18) is connected to the piezoelectric transducer which delivers voltage pulses to it, said pulses having a gently rising or falling flank which is followed by a steeply falling or rising flank, respectively, and wherein the *driven* bearing element (5) has inertia which is largely overcome by the gently rising or falling flank and which results in movement of the bearing element (5), said inertia essentially preventing reverse movement of the bearing element (5) by the steeply falling or rising flank of the pulses*, wherein the steeply falling or rising flank is performed within a time period of less than 10 μsec.*

16. An adjusting device for microscopic movements, [with] *comprising:* a carrier element with, fixed on the carrier element, at least one drive element comprising a piezoelectric transducer which utilizes the shear effect, and with a bearing element which rests on the drive element, [characterized in that] *wherein* only the drive element (6) and the bearing element (5) are in their form and disposition constructed for mutual mounting and for the performance of a guided microscopic movement, and in that a pressure applying device (8) is provided which presses the bearing element (5) and the drive element (6) against each other with a predetermined force at right angles to the direction of movement, in that to trigger the shear effect drive of the piezoelectric transducer, a control unit (18) is connected to the piezoelectric transducer which delivers to the transducer an adjustable voltage pattern with predetermined different rise and fall times, in order to continuously position the bearing element (5) within the framework of the maximum deflection of the piezoelectric transducer (6), said bearing element (5) having inertia whereby it responds with one displacement corresponding to said predetermined rise time, said displacement being different from that corresponding to said different predetermined fall time, *and wherein a voltage of the adjustable voltage pattern is raised to a maximum value within a period of less than 10 μsec which is then followed by a slow abatement of voltage which reaches zero after a period of time.*

17. *An adjusting device for microscopic movements comprising: a driven bearing element, a carrier element and at least one drive element performing a unidirectional move-*

*ment, wherein said drive element is fixed to the carrier element and wherein said drive bearing element directly rests on said drive element mutually being in frictional contact with each other wherein said drive element comprising a piezoelectric transducer directly providing said frictional contact or a piezoelectric transducer having its own support to support the driven bearing element to provide said frictional contact, wherein said support is disposed on a side of the piezoelectric transducer which is towards said driven bearing element, wherein the piezoelectric transducer utilises the shear effect, wherein the drive element (6) produces not only the movement of the driven bearing element, but in addition also guides the bearing element in the direction of movement and wherein only the at least one drive element and the driven bearing element (5) are in their form and disposition constructed for mutual mounting and for the performance of a guided microscopic movement, wherein a pressure applying device (8) is provided which presses the driven bearing element (5) and the drive element (6) against each other with a predetermined force at right-angles to the direction of movement, and wherein the driven bearing element (5) is a plate having a guide groove which rests on a drive element.*

\* \* \* \* \*